(12) United States Patent
Tanbakuchi et al.

(10) Patent No.: US 8,471,580 B2
(45) Date of Patent: Jun. 25, 2013

(54) DOPANT PROFILE MEASUREMENT MODULE, METHOD AND APPARATUS

(75) Inventors: Hassan Tanbakuchi, Santa Rosa, CA (US); Roger B. Stancliff, Santa Rosa, CA (US); Timothy M. Graham, Santa Rosa, CA (US); Wenhai Han, Chandler, AZ (US)

(73) Assignee: Agilent Technologies, Inc., Santa Clara, CA (US)

( * ) Notice: Subject to any disclaimer, the term of this patent is extended or adjusted under 35 U.S.C. 154(b) by 513 days.

(21) Appl. No.: 12/749,833

(22) Filed: Mar. 30, 2010

(65) Prior Publication Data

US 2010/0244870 A1    Sep. 30, 2010

Related U.S. Application Data

(60) Provisional application No. 61/165,149, filed on Mar. 31, 2009.

(51) Int. Cl.
*G01R 31/302*    (2006.01)

(52) U.S. Cl.
USPC ............. 324/754.31; 324/754.21; 324/762.01

(58) Field of Classification Search
None
See application file for complete search history.

(56) References Cited

U.S. PATENT DOCUMENTS

| | | | | |
|---|---|---|---|---|
| 5,065,103 | A | * | 11/1991 | Slinkman et al. ............. 324/458 |
| 5,742,172 | A | * | 4/1998 | Yasutake .................. 324/750.22 |
| 7,372,025 | B2 | | 5/2008 | Hoen et al. |
| 2002/0033708 | A1 | | 3/2002 | Weiss et al. |
| 2008/0099761 | A1 | | 5/2008 | Feustel et al. |
| 2009/0084952 | A1 | | 4/2009 | Rutgers et al. |
| 2009/0100554 | A1 | | 4/2009 | Arnold et al. |

OTHER PUBLICATIONS

Erikson, et al. "Scanning capacitance microscopy", MultiProbe, 2007, www.multiprobe.com, p. 1-4.

* cited by examiner

*Primary Examiner* — Minh N Tang

(57) ABSTRACT

An apparatus comprises: a first signal source; a dopant profile measurement module (DPPM) configured to receive a portion of the signal from the signal source; a probe tip connected to the reflective coupler; a load connected in parallel with the probe tip; and a second signal source connected to a load, wherein the signal source is configured to provide an amplitude-modulated (AM) signal to the probe tip. A method is also described.

17 Claims, 4 Drawing Sheets

DOPANT PROFILE MEASUREMENT MODULE, METHOD AND APPARATUS

CROSS-REFERENCE TO RELATED APPLICATIONS

The present application claims priority under 35 U.S.C. §119(e) from U.S. Provisional Patent Application 61/651,149 entitled "Dopant Profile Measurement Module, Method and Apparatus" filed on Mar. 31, 2009. The entire disclosure of this provisional patent application is specifically incorporated herein by reference.

BACKGROUND

The measurement of the doping profile of semiconductor devices is useful in determining junction depths (dopant density), which in turn, are useful for the design process. For example, transistor design is based on modeling and/or mathematical equations. These equations are based on physical properties, such as junction depth (dopant density), or behavior.

One method of determining the junction depth of the device, junction staining for one dimensional analysis was typically done. The junction staining involved angle lapping and then staining the junction and measuring. The staining process comprises applying a chemical etchant which will preferentially attack n+doped material or p+doped material, allowing the technician to delineate the location of the junction and measure its depth. Two dimensional junction depth measurement is necessary when submicron features are being formed, because many two dimensional electric field effects need to be accounted for. Various prior art chemical staining and Auger spectroscopy techniques have been used, but have drawbacks. For example, many known methods have feature-size limits, and others involve destructive measurements.

What is needed, therefore, is a method and apparatus for measuring doping profiles that overcomes at least the drawbacks of known devices and methods described above.

SUMMARY

In accordance with a representative embodiment, a method of measuring a capacitance of a semiconductor comprises: applying a low frequency modulating voltage to a location of the semiconductor; and simultaneously measuring the capacitance as a function of the low frequency modulating voltage.

In accordance with another representative embodiment, an apparatus, comprises a first signal source; a dopant profile measurement module (DPMM) configured to receive a portion of the signal from the signal source; a probe tip connected to the reflective coupler; a load connected in parallel with the probe tip; and a second signal source connected to a load, wherein the signal source is configured to provide an amplitude-modulated (AM) signal to the probe tip.

In accordance with another representative embodiment, an apparatus for measuring a doping level of a sample comprises: a first signal source; a dopant profile measurement module (DPMM) configured to receive a portion of a signal from the first signal source; a reflective coupler configured to receive a second portion of the signal from the reference coupler; a probe tip connected to the reflective coupler; a load connected in parallel with the probe tip; and a second signal source connected to a load. A method comprises: transmitting the signal from the first signal source to the reference coupler; providing the first portion of the signal to the DPMM; providing the second portion of the signal to a reflective coupler and to the probe tip; providing an amplitude modulated (AM) signal to the probe tip; modulating the second portion of the signal with the AM signal; and reflecting the modulated portion of the signal back to the reflective coupler.

In accordance with another representative embodiment, a method of measuring a capacitance of a semiconductor comprise applying a comparatively low frequency modulating voltage to a location of the semiconductor; and simultaneously measuring the capacitance as a function of the low frequency modulating voltage at a comparatively high frequency.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

It is to be understood that the terminology used herein is for purposes of describing particular embodiments only, and is not intended to be limiting.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. Descriptions of known systems, devices, materials, methods of operation and methods of manufacture may be omitted so as to avoid obscuring the description of the example embodiments. Nonetheless, systems, devices, materials and methods that are within the purview of one of ordinary skill in the art may be used in accordance with the representative embodiments.

The detailed description which follows presents methods that may be embodied by routines and symbolic representations of operations of data bits within a computer readable medium, associated processors, microprocessors, digital storage oscilloscopes, general purpose personal computers, manufacturing equipment, configured with data acquisition cards and the like. In general, a method herein is conceived to be a sequence of steps or actions leading to a desired result, and as such, encompasses such terms of art as "routine," "program," "objects," "functions," "subroutines," and "procedures."

The apparatuses and methods of the illustrative embodiments are described in implementations in a measurement system including one or more testing devices. Machines that may perform the test functions according to the present teachings include those manufactured by companies such as AGILE TECHNOLOGIES, INC., TEKTRONIX, INC., FLUKE CORPORATION, NATIONAL INSTRUMENTS, INC., as well as other manufacturers of test and measurement equipment.

Figure 1A:
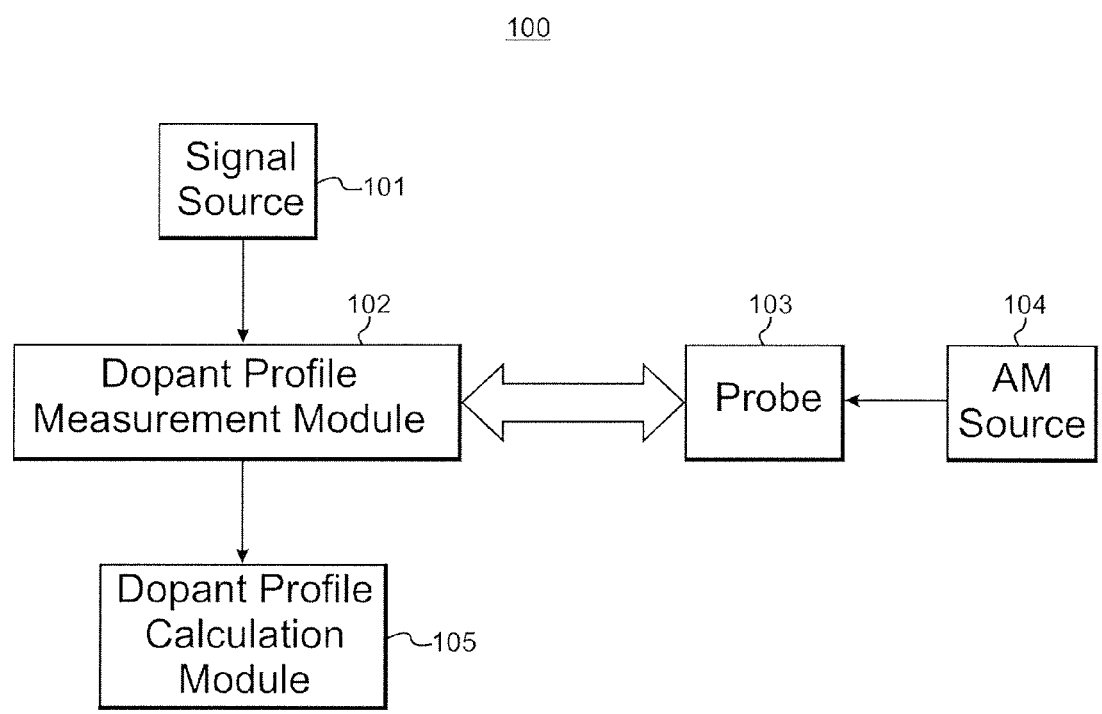
FIG. 1A shows a simplified block diagram of an apparatus including a dopant profile measurement module in accordance with a representative embodiment.

FIG. 1A shows a simplified block diagram of an apparatus 100 including a dopant profile measurement module (DPPM) 102 in accordance with a representative embodiment. The apparatus 100 may comprise a performance network analyzer (PNA) or any Vector Network Analyzer, or any MW reflectometer (not shown), with the DPMM 102 and other components described herein being, for example, an add-on module (s) to the PNA.

The apparatus 100 comprises a signal source 101, which is optima configured to provide a comparatively highly spectrally pure signal (i.e., not essential due to common mode phase noise rejection in the mixer) to the DPMM 102. The apparatus further comprises a probe, an amplitude modulated (AM) signal source 104 and a dopant profiled calculation module 105.

Illustratively, the signal source is a vector network analyzer (VNA) or comparable signal source. This is merely illustrative, and notably other signal generators are contemplated. These signal generators may comprise devices for direct digital synthesis (DDS) that in turn may comprise numerically controlled oscillators (NCOs).

As described more fully herein, a portion of the signal from the signal source 101 is provided to the DPMM 102, and a portion of the signal is passed to the prove 103. The probe 103 is illustratively an atomic force microscopy (AFM) device comprising a cantilevered tip (not shown). In a representative embodiment, the AFM is a scanning microwave microscope (SMM). Many details of the AFM of the representative embodiments are described in commonly owned U.S. Pat. No. 7,372,025 to Hoen, et al. and entitled "Scanning Probe Microscope Using a Surface Drive Actuator to Position the Scanning Tip." The disclosure of this patent is specifically incorporated herein by reference.

An AM signal is provided to the probe 103 by the AM signal source 104. The signal from the signal source is illustratively a microwave signal, whereas the AM signal is illustratively an RF signal (<100 KHz typically). The MW signal provides a stimulus of interaction with a nonlinear impedance between the probe 103 and a sample (not shown). In a representative embodiment, the sample is a doped semiconductor, and may be a transistor having a certain doping profile, or other semiconductor device comprising one or more junctions. Notably, because the flatband transfer function of a semiconductor device is a function of dopant density the variable capacitance of the device due to modulation of the reflected MW signal with the AM signal can be used to determine the capacitance versus voltage and therefore the dopant profile as a function of voltage. As such, in accordance with a representative embodiment, the AM modulation index is function of the dopant density.

The nonlinear impedance is a product of a RF frequency drive and the sample. A flatband transfer function that corresponds to dopant density is mixed on the MW stimulus, which is reflected back from the probe 103 to the DPMM 102. As described more fully herein, the reflected signal is mixed with the portion of the signal from the signal source 101, is further down converted and is delivered to a lock-in amplifier (not shown) for further analysis. Ultimately, a current-voltage transfer function is used to determine the doping profile of the sample. Notably, because the signal from the local oscillator of the mixer is portion of the stimulus microwave signal, the flatband transfer function is transposed on the stimulus signal and mixed down in the mixer of the DPMM. The phase noise of the LO and reflected signal are correlated and therefore the IF of the mixer and the measurement is immune from the phase jitter of the source (stimulus).

Figure 1B:
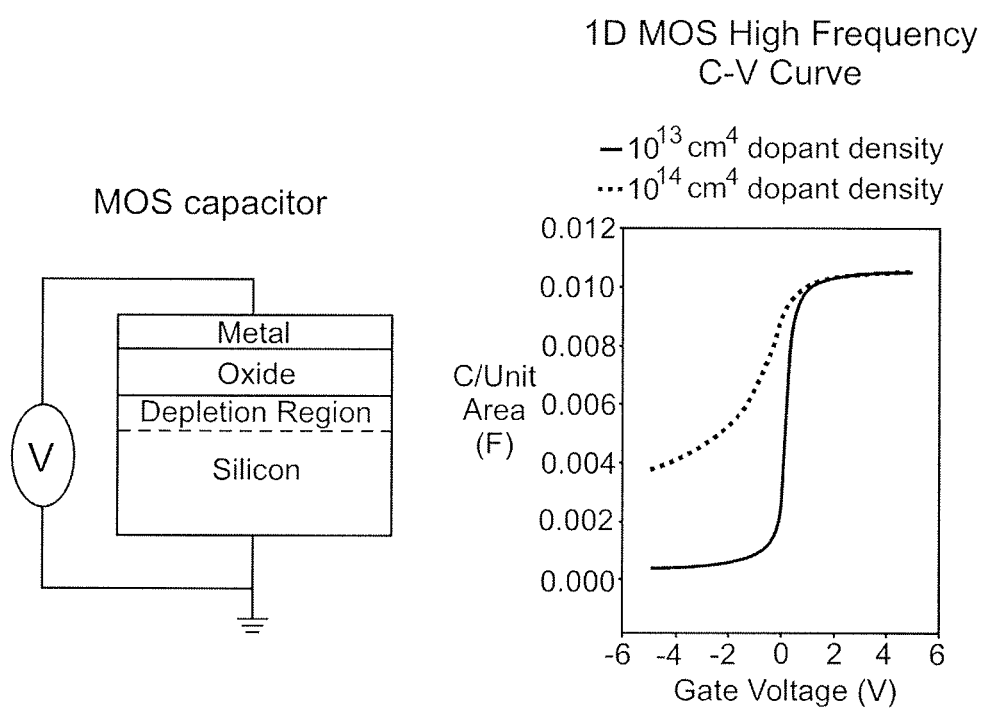
FIG. 1B shows a simplified schematic diagram and a capacitance-voltage transfer function for a metal-oxide-semiconductor (MOS) capacitor in accordance with a representative embodiment.

FIG. 1B shows a simplified representation of the features of the apparatus 100. Notably, a doping profile of a MOS capacitor is desired. A variable voltage is applied; in this case, the voltage from the AM signal is applied across the MOS capacitor as voltage (V) is shown. Based on the change in capacitance per change in voltage from the AM signal, the doping levels can be determined over the device, and a doping profile can be garnered. In practice a well defined oxide layer is grown and polished on top of the semiconductor substrate (not shown) in order to insulate the dopant from the probe 103. This polishing procedure can be eliminated by adding an appropriate DC voltage (positive for P type, negative for N type) to the probe 103 generating an artificial thin isolation layer via the generation of a depletion under the tip.

The samples also exhibit nonlinear behavior when subject to low frequency RF signal from the AM signal source 104, causing the change in the real and imaginary part of the capacitive tip/sample impedance. The change of the capacitive impedance of the sample is measured by probe 103, which is an SMM in the representative embodiment. As described more fully below, the change in the capacitive impedance is magnified by the difference between the frequencies of the signal source 101 (MW) and the AM signal source 104 (RF). The changes in the capacitance C ($\Delta$C) is function of the RF frequency. AC is proportional to dopant density. One can measure the change in this impedance under the probe at the RF frequency here shown as $\omega_0$. The magnitude of the impedance change at the RF frequency would be $1/(\omega_0 * \Delta C)$. At RF frequencies, the impedance change is comparatively indiscernible. By contrast, and in accordance with a representative embodiment, measurement of the change in the impedance caused by driving the probe 103 at the RF frequency at MW frequency is made. The change in magnitude of the impedance at MW frequencies is $1/(\omega * \Delta C)$, where $\omega$ is the frequency of MW signal. As such, the change in the impedance is multiplied by the ratio of the two frequencies when the measuring stimulus is at microwave frequency rather than RF frequencies for capacitance measurements. Therefore the change in the impedance is magnified by the ratio of the MW frequency to RF frequency.

According to representative embodiments, a change of the capacitance driven by the low frequency RF is $\Delta$C, is manifest as a change in the impedance is $1/(2\pi j f \Delta C)$ where f is the measurement frequency. Thus, from this relation it can be seen that a significant gain in sensitivity of changes in impedance when the changes in capacitance is measured with a MW stimulus verses the RF. Therefore it can be appreciated from the relationship that the sensitivity of the measurement (changes in the impedance) is multiplied by the stimulus frequency. Therefore measuring the changes of the sample impedance induced by low frequency RF signal at MW frequencies increases the sensitivity markedly.

The output of the DPMM is provided to the dopant profile calculation module 105. The dopant profile calculation module 105 comprises a processor (not shown), memory and software useful in computing the dopant levels and dopant profiles based on the measured capacitance at the DPMM. The dopant profile calculation module 105 may include lookup tables for determining the dopant levels, or may include software that algorithmically calculates the dopant levels.

Figure 2:
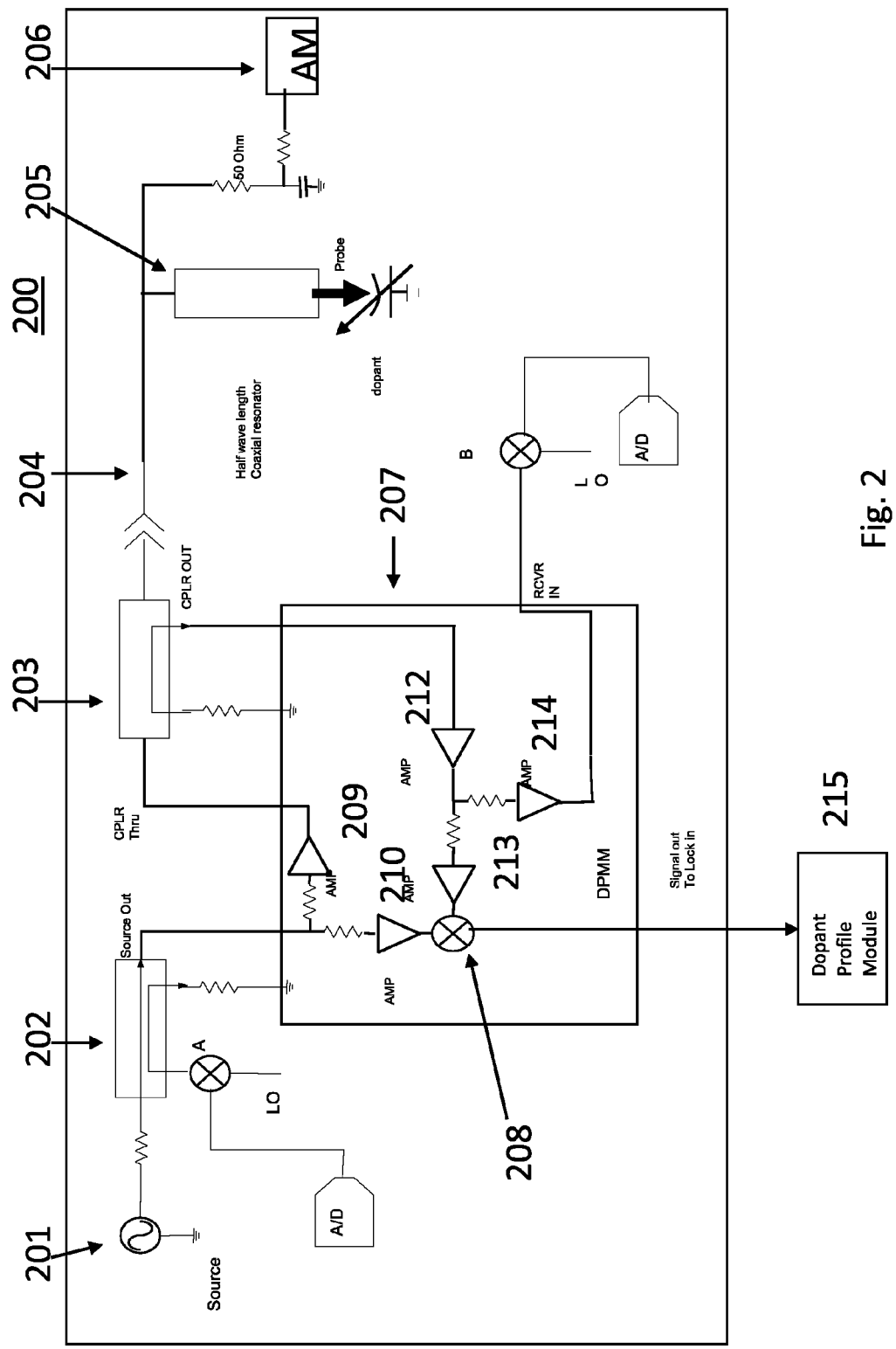
FIG. 2 shows a simplified schematic diagram of an apparatus including a dopant profile measurement module in accordance with a representative embodiment.

FIG. 2 shows a simplified schematic diagram of an apparatus 200 including a dopant profile measurement module 207 in accordance with a representative embodiment. The apparatus 200 comprises certain common features, characteristics and benefits described in detail above in connection with FIGS. 1A and 1B. Many of these details are common to the representative embodiments described presently, and are not repeated.

The apparatus 200 comprises a first signal source 201 provides a first signal. The first signal is a continuous wave (CW) signal at a comparatively high frequency (e.g., a microwave (MW) frequency) and may be a VNA or similar signal generator as described above. The first signal from the first signal source 201 is provided to a first coupler 202. The first coupler 202 provides an output signal (designated Source Out in FIG. 2) to the DPMM 207. The output signal is divided into two portions inside the DPMM. The first portion of the output signal is provided to amplifier 210 where it is amplified and then provided to a DPPM mixer (multiplier) 208 and used as the local oscillator signal (LO) for the DPMM mixer 208, as described more fully below. The second portion of the output signal is amplified by amplifier 209 and provided to a second coupler 203. The second portion of the output signal is provided by the second coupler to a probe 205 via a half-wave transmission line 204. As discussed previously, the probe 205 is illustratively an SMM or similar AFM device.

A second signal source 206 provides a second signal to the probe 205. The second signal is a comparatively low frequency (e.g., RF frequency) signal that is amplitude modulated. The second signal is used to modulate the dopant through the native oxide interface of the semiconductor device being tested. As alluded to previously, the second signal (the AM signal) provides the input voltage across the semiconductor device and from this voltage, a measure of the change in capacitance through a change in the capacitive impedance is garnered. Once the capacitance for each voltage is determined, a dopant level can be determined for each capacitance-voltage combination through a C-V transfer function.

The impedance mismatch created at the comparatively high impedance probe 205 causes a significant portion of the input signal from the DPMM 207 to be reflected back to the second coupler 203. As such, the signal from the first signal source 201 at the comparatively high (e.g., MW) frequency is reflected and modulated by the second signal (AM signal) from the second signal source 206 at the comparatively low (e.g., RF frequency) at a rate equal to the RF frequency. The modulation index of the reflected MW signal is proportional to the dopant density (magnitude and phase of the modulated signal).

The reflected signal is provided to the DPMM 207 via the second coupler 203 (at CPLR OUT) to the amplifier 212. The signal is split with a portion provided to amplifier 213 and a portion provided to amplifier 214. The signal from the amplifier 214 is input to the DPMM mixer 208, where it is multiplied by the amplified signal from the amplifier 210. Thus, the source out signal from the first coupler is used as the LO signal for the DPMM mixer 208. Because the reflected signal from the probe 205 comprises a significant portion of the incident signal to the probe because of the mismatch of the impedance, the output of the DPMM mixer 208 comprises substantially the modulation on the signal from the amplifier 214. The modulation on this mixed signal is stripped out and directed out of the DPMM 200 to a dopant profile module 215 as an intermediate frequency (IF) signal.

As noted previously, the signal from the first signal source 201, illustratively a MW signal, is modulated by the AM signal from the second signal source 206. Where the AM modulation rate is substantially equal to the C-V signal variation. Thus, the applied voltage provides a capacitance level and the C-V curve data are determined for the sample. From the capacitance versus voltage data, the doping level can be obtained.

The dopant profile module 215 illustratively comprises a processor (not shown); memory and software useful in determining from the IF signal from the DPMM 207 the doping level over the sample and thus the doping profile. The C-V data in concert with dopant standard calibration chips are used to determine the dopant density of the sample. The output of the Mixer is fed to a LOCKIN amplifier tuned to the RF frequency. The LOCKIN amplifier output is referenced against the RE stimulus therefore it is magnitude and phase proportional to the flatband transfer function and dopant.

Finally, the signal from the amplifier 213 is provided to another mixer via RCVR IN. This signal is used to measure the average dopant capacitance. The PNA local oscillator is a separate signal source within the PNA that down converts the reflected signal to the PNA intermediate frequency (IF) for further digitization and analysis. The PNA mixer is a heterodyne mixer, and as such, the local oscillator signal and the microwave signal are at offset frequencies equal to the PNA IF frequency. The reflected signal to PNA IF frequency in microwave frequency for further digitization. This IF signal has the same RF modulation index representing the dopant constant as the MW signal has. The IF is digitized in the PNA digitizer and further filtered via a narrow bandwidth filter with a bandwidth typically much less than the RE signal. Therefore, the PNA will filter out the modulated RE signal to an average value of the capacitance, since its variation has been filtered out. In the DPMM a homodyne receiver (LO and RF at the same frequency) is used so that the output of the mixer (IF) is the modulated capacitance and it is detected using LOCKIN amplifier.

Figure 3:
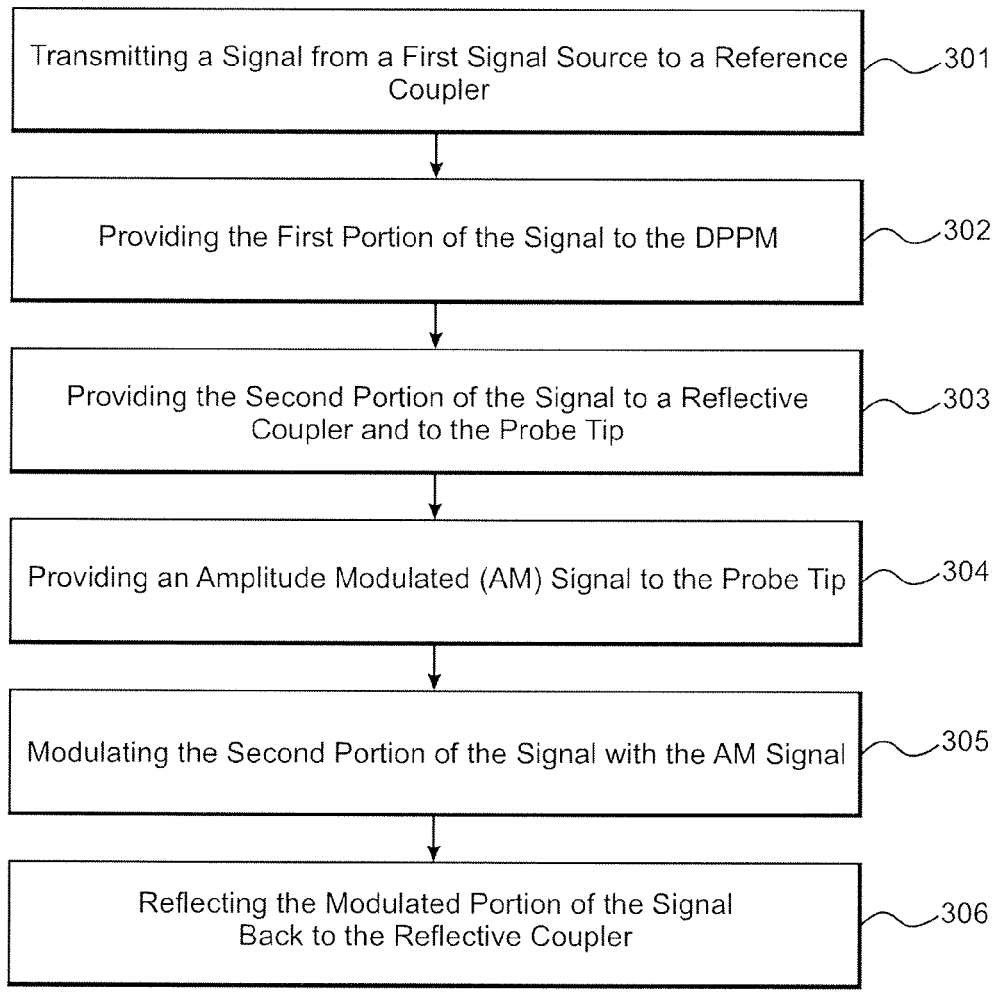
FIG. 3 shows a flow-chart of a method in accordance with a representative embodiment.

FIG. 3 shows a flow-chart of a method in accordance with a representative embodiment. The method includes features and sequences such as described in connection with the representative embodiments of FIGS. 1A-2, and is implemented in connection with the apparatus, modules, hardware and software described in conjunction therewith.

At 301, the method comprises transmitting the signal from the first signal source 201 to the first coupler 202. At 302, the method comprises providing the first portion of the signal to the DPMM 207. At 303, the method comprises providing the second portion of the signal to the second coupler 203 and to the probe 205. At 304, the method comprises providing an amplitude modulated (AM) signal (e.g., from second signal source 206) to the probe 205. At 305, the method comprises modulating the second portion of the signal with the AM signal. At 306, the method comprises reflecting the modulated portion of the signal back to the second coupler.

In the representative embodiments described herein, a DPMM, an apparatus and a method of using a DPMM are described. As will be appreciated by one of ordinary skill in the art, many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. An apparatus, comprising:
   a first signal source;
   a dopant profile measurement module (DPMM) configured to receive a portion of the signal from the first signal source;
   a probe tip connected to a reflective coupler;
   a load connected in parallel with the probe tip; and
   a second signal source connected to the load, wherein the second signal source is configured to provide an amplitude-modulated (AM) signal to the probe tip.

2. An apparatus as claimed in claim 1, further comprising:
   a reference coupler configured to receive a signal from the first signal source, and to provide the portion of the signal to the DPMM.

3. An apparatus as claimed in claim 2, wherein the reflective coupler is configured to receive another portion of the signal from the reference coupler.

4. An apparatus as claimed in claim 2, wherein the DPMM further comprises a mixer configured to receive the portion of the signal from the reference coupler.

5. An apparatus as claimed in claim 4, wherein the reflective coupler is configured to receive a reflected signal from the probe tip and to provide the reflected signal to the mixer.

6. An apparatus as claimed in claim 5, wherein a modulation index of the reflected signal is proportional to a doping concentration.

7. An apparatus as claimed in claim 4, wherein the portion of the signal from the reference coupler provides a local oscillator (LO) input to the mixer.

8. An apparatus as claimed in claim 1, wherein the other portion of the signal is reflected by the probe tip and is modulated at a frequency of the AM signal.

9. An apparatus as claimed in claim 1, wherein the probe tip contacts a sample, and the AM signal applies a voltage that changes a capacitance at the probe tip.

10. An apparatus as claimed in claim 9, wherein the sample comprises a semiconductor comprising a doping profile.

11. An apparatus as claimed in claim 9, wherein the AM signal has a frequency f and the change in capacitance ($\Delta C$) results in a change in impedance equal to $1/(2\pi f\Delta C)$.

12. An apparatus as claimed in claim 9, wherein the probe tip is a probe tip of an atomic force microscope (AFM).

13. In an apparatus for measuring a doping level of a sample, the apparatus, comprising: a first signal source; a dopant profile measurement module (DPMM) configured to receive a portion of a signal from the first signal source; a reflective coupler configured to receive a second portion of the signal from a reference coupler; a probe tip connected to the reflective coupler; a load connected in parallel with the probe tip; and a second signal source connected to the load, a method, comprising:
   transmitting the signal from the first signal source to the reference coupler;
   providing the first portion of the signal to the DPMM;
   providing the second portion of the signal to the reflective coupler and to the probe tip;
   providing an amplitude modulated (AM) signal to the probe tip;
   modulating the second portion of the signal with the AM signal; and
   reflecting the modulated portion of the signal back to the reflective coupler.

14. A method as claimed in claim 13, further comprising:
   providing the modulated portion of the signal to a mixer at the DPMM; and
   mixing the modulated portion of the signal with the first portion of the signal to provide an output indicative of a doping concentration.

15. A method as claimed in claim 14, wherein the first portion of the signal provides a local oscillator (LO) input to the mixer.

16. A method as claimed in claim 13, further comprising contacting the sample with the probe tip whereby the AM signal applies a voltage that changes a capacitance at the probe tip.

17. A method as claimed in claim 16, wherein the sample comprising a semiconductor comprising a doping profile.

* * * * *

UNITED STATES PATENT AND TRADEMARK OFFICE
CERTIFICATE OF CORRECTION

PATENT NO. : 8,471,580 B2  
APPLICATION NO. : 12/749833  
DATED : June 25, 2013  
INVENTOR(S) : Hassan Tanbakuchi et al.

Page 1 of 1

It is certified that error appears in the above-identified patent and that said Letters Patent is hereby corrected as shown below:

On Title page, Item (57), under "Abstract", in column 2, line 2, Delete "(DPPM)" and insert -- (DPMM) --, therefor.

In the Claims:

In column 8, line 5, in claim 11, Delete "$1/(2\pi f\Delta C)$." and insert -- $1/(2\pi j f\Delta C)$. --, therefor.

Signed and Sealed this  
Third Day of September, 2013

Teresa Stanek Rea  
*Acting Director of the United States Patent and Trademark Office*